United States Patent [19]

Sagnard et al.

[11] Patent Number: 4,622,647
[45] Date of Patent: Nov. 11, 1986

[54] SYSTEM FOR THE AUTOMATIC TESTING OF PRINTED CIRCUITS

[75] Inventors: François-Regis Sagnard, Paris; Claude Ruelle, Linas, both of France

[73] Assignee: Rank Xerox SA, Puteaux, France

[21] Appl. No.: 516,261

[22] Filed: Jul. 22, 1983

[30] Foreign Application Priority Data

Jul. 27, 1982 [FR] France .................................. 82 13114

[51] Int. Cl.[4] ......................... G06F 11/22; G01R 31/28
[52] U.S. Cl. ............................... 364/580; 324/73 AT; 371/20; 371/27
[58] Field of Search ............... 364/578, 579, 580, 200, 364/900; 371/20, 27; 324/73 R, 73 AT

[56] References Cited

U.S. PATENT DOCUMENTS

| 3,961,250 | 6/1976 | Snethen | 371/20 |
| 4,108,358 | 8/1978 | Niemaszyk et al. | 371/20 |
| 4,125,763 | 11/1978 | Drabing et al. | 371/20 |
| 4,168,527 | 9/1979 | Winkler | 371/20 |
| 4,216,539 | 8/1980 | Raymond et al. | 371/20 |
| 4,308,615 | 12/1981 | Koegel et al | 371/20 |
| 4,312,067 | 1/1982 | Shirasaka | 324/73 |
| 4,354,268 | 10/1982 | Michel et al. | 364/580 |
| 4,380,070 | 4/1983 | Steiner | 371/20 |
| 4,439,858 | 3/1984 | Petersen | 371/20 |
| 4,450,560 | 5/1984 | Conner | 324/73 R |
| 4,455,654 | 6/1984 | Bhaskar et al. | 371/20 |
| 4,500,993 | 2/1985 | Jacobson | 371/20 |

FOREIGN PATENT DOCUMENTS

| 21888 | 1/1981 | European Pat. Off. | 364/900 |
| 53561 | 6/1982 | European Pat. Off. | 371/20 |
| 2059122 | 4/1981 | United Kingdom . | |

OTHER PUBLICATIONS

West et al: Analyzer+Emulation=Faster Board Testing, Electronic Design, Oct. 11, 1980, pp. 177–181.
Lyons: Microprocessor Based PCB's, The Testing Challenge. IEEE Electro 76 Professional Program Boston, May 1976, pp. 18-3/1–18-3/5.
Coffron: Serially Testing a Board's States Takes the Trickiness Out of Debugging It. Electronics, Jan. 27, 1982, pp. 100–103.
Peyrucat: Pour le Test de Cartes Ayez Une Approche Adaptee a vos Besoins, Mesures–Regulation–Automatisme (France) Nov. 1981-pp. 7-35 vol. 46, No. 11.

Primary Examiner—Felix D. Gruber
Attorney, Agent, or Firm—Lewis H. Eslinger

[57] ABSTRACT

The test system comprises a standard basic unit with a central unit, a read-only memory, a read/write memory for recording test programs transmitted from a bulk memory and interfaces; the basic unit is connected to the card to be tested via a specific unit corresponding to the card to be tested to allow the realization of a static test. The test system further comprises a simulation device including: microprocessor simulation means connected to the busses of the basic unit and to a gripper connectable to the terminals of a microprocessor of a card to be tested to allow a dynamic test of the card to be tested at the real speed of the microprocessor of said card; and a ROM simulation means connected to the busses of the basic unit and to a plug which can be mounted on a support of a ROM package unit on the card to be tested to allow a functional test of said card to be performed by causing the microprocessor of said card to execute a program loaded in said ROM simulation means.

5 Claims, 8 Drawing Figures

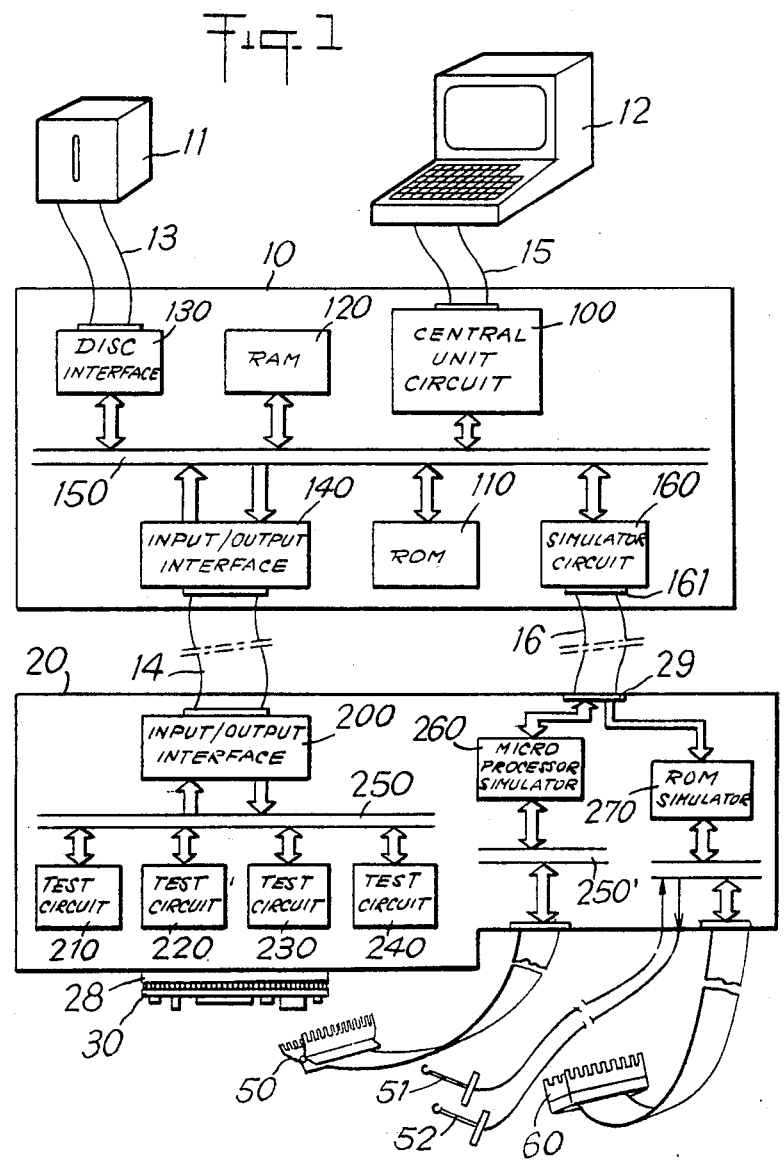

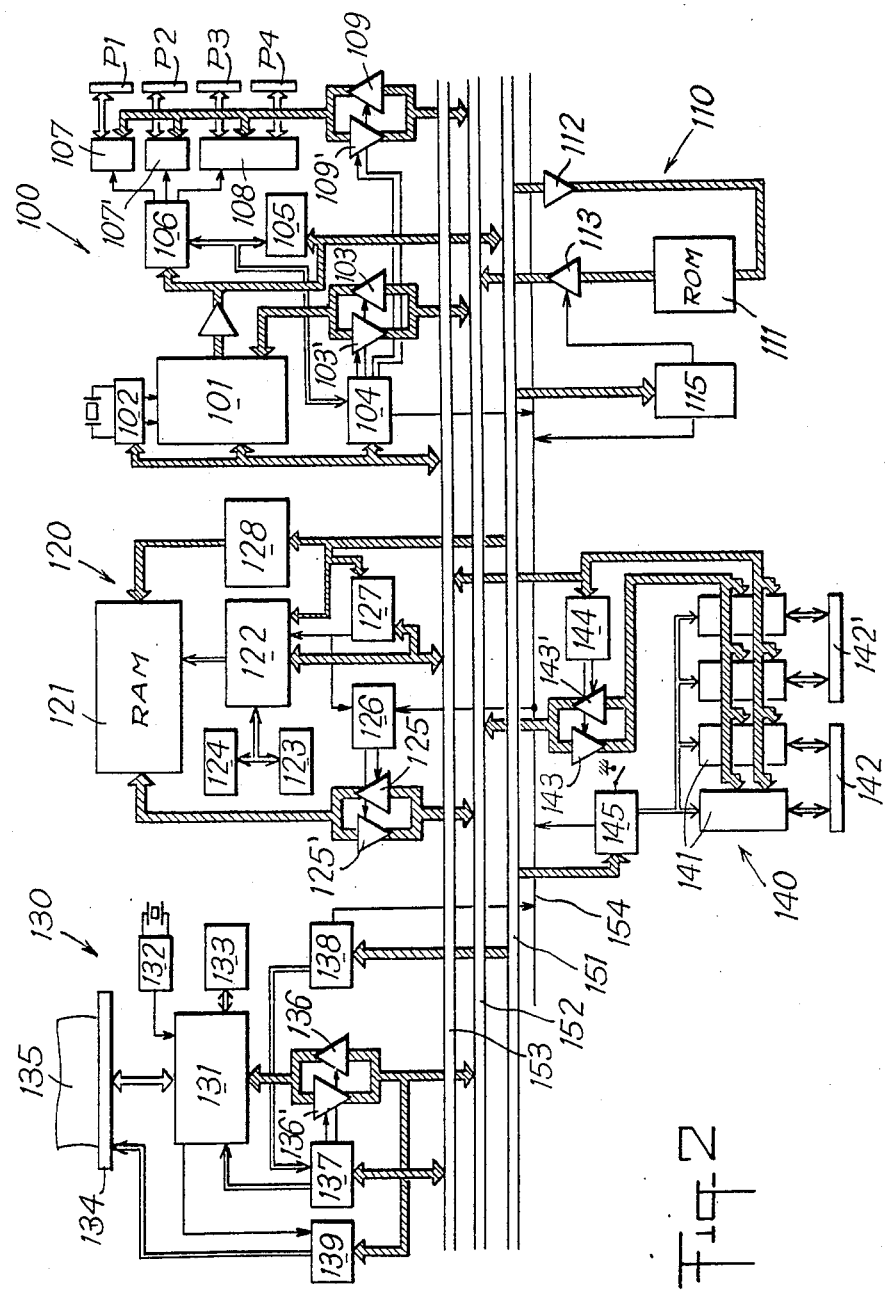

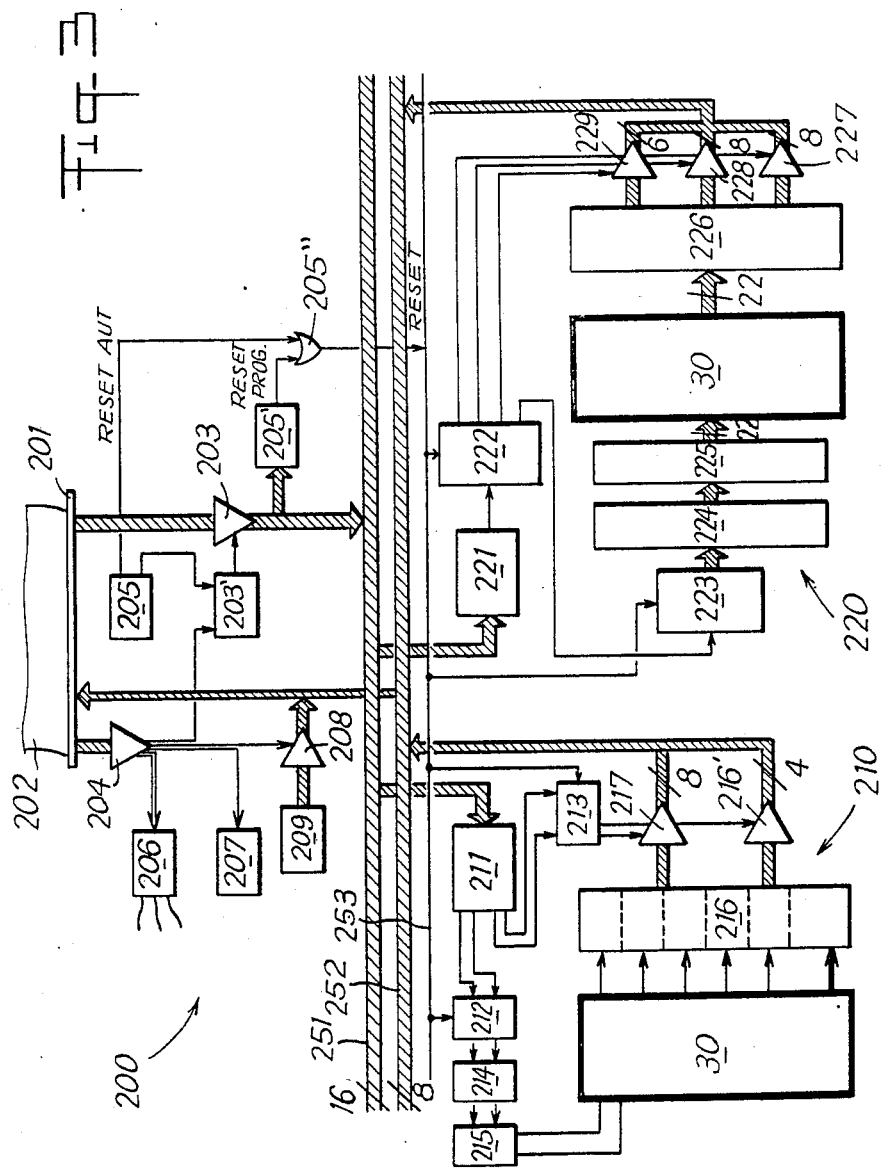

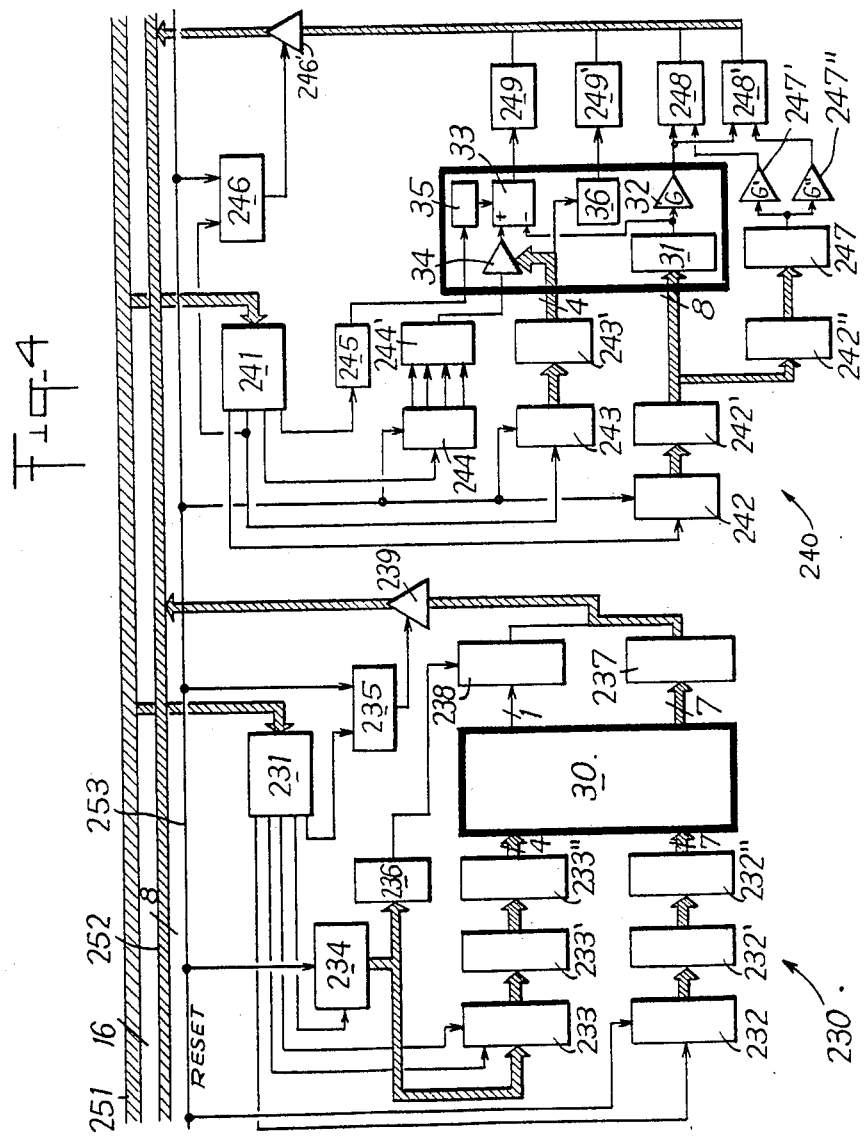

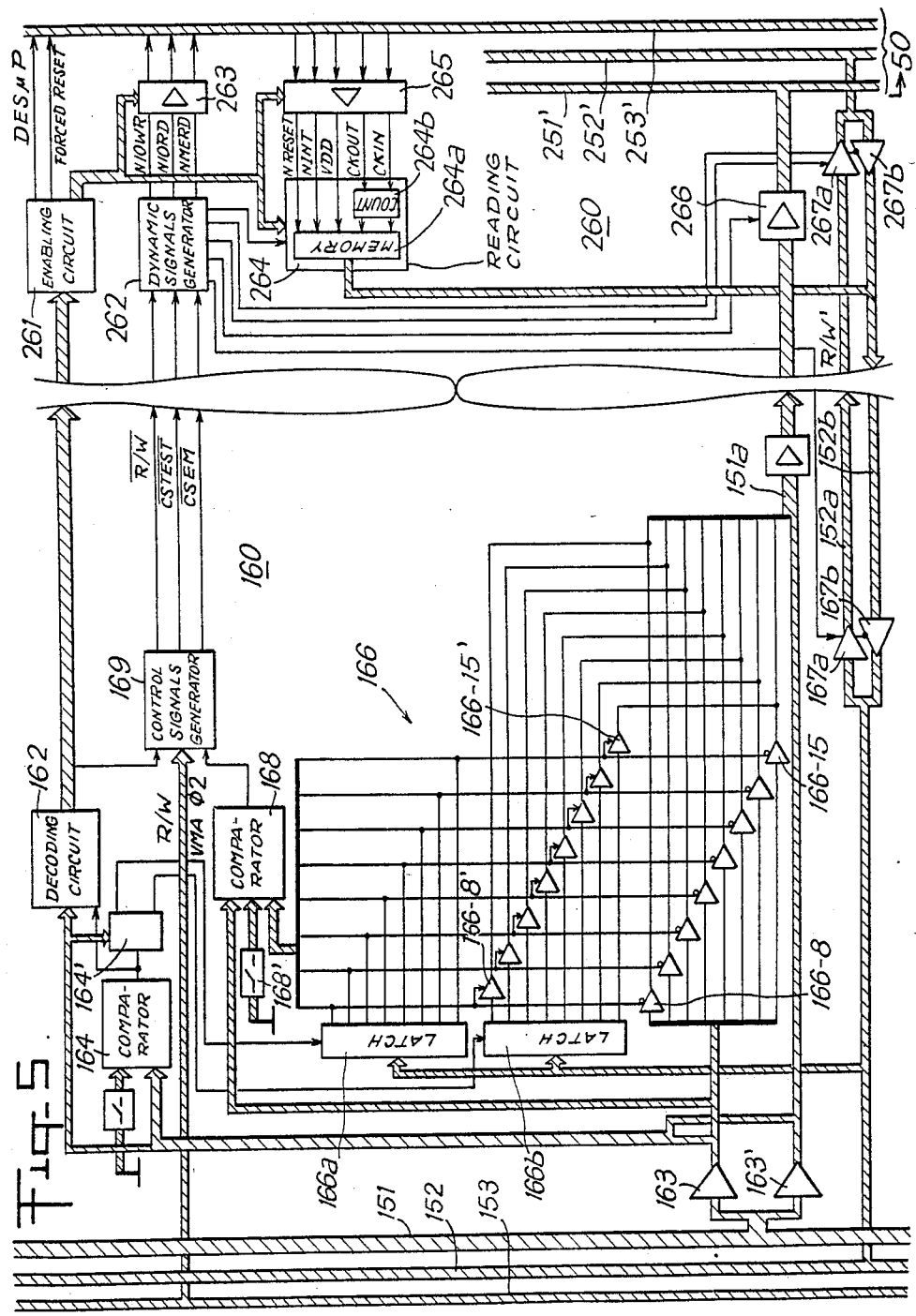

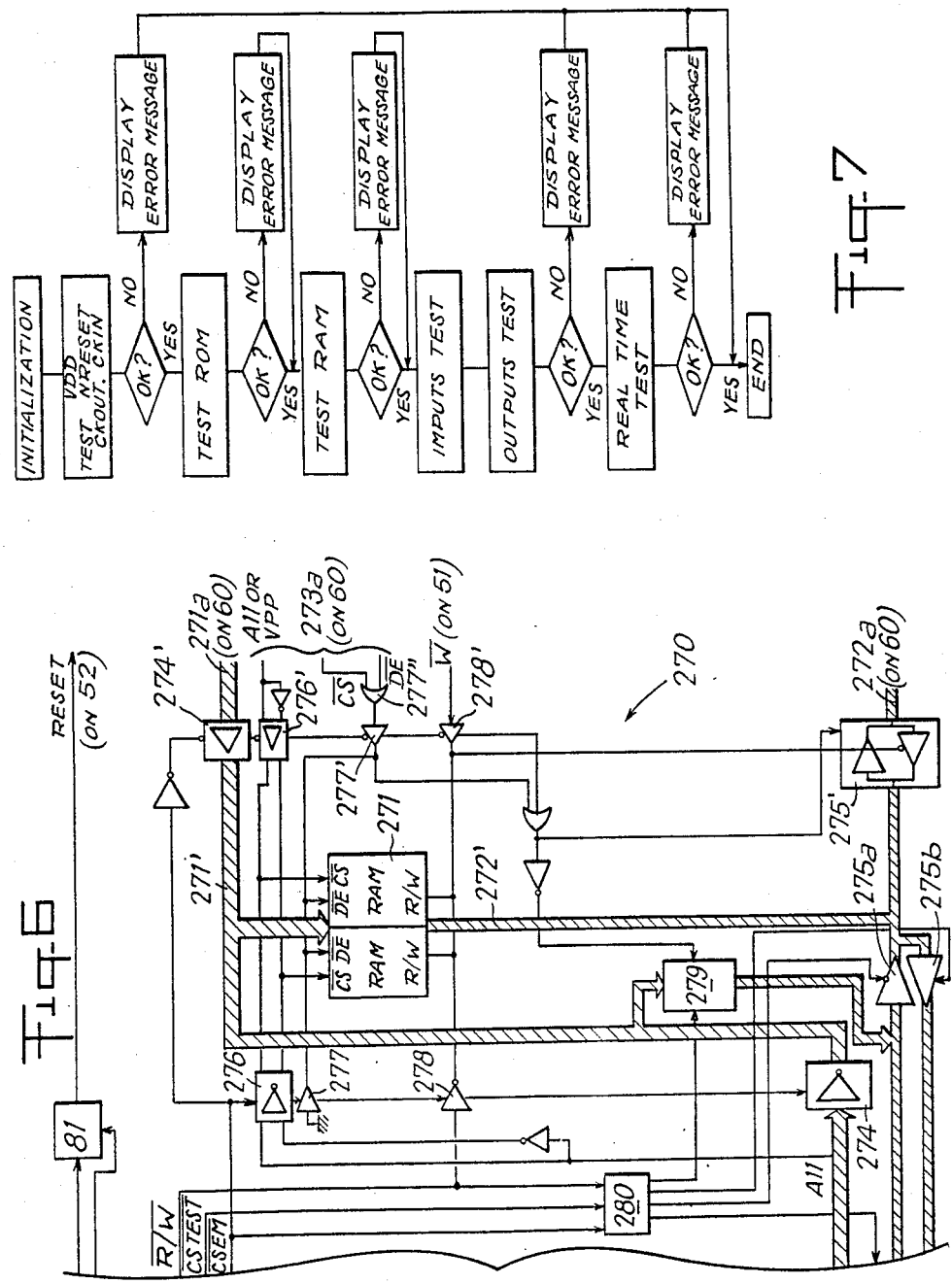

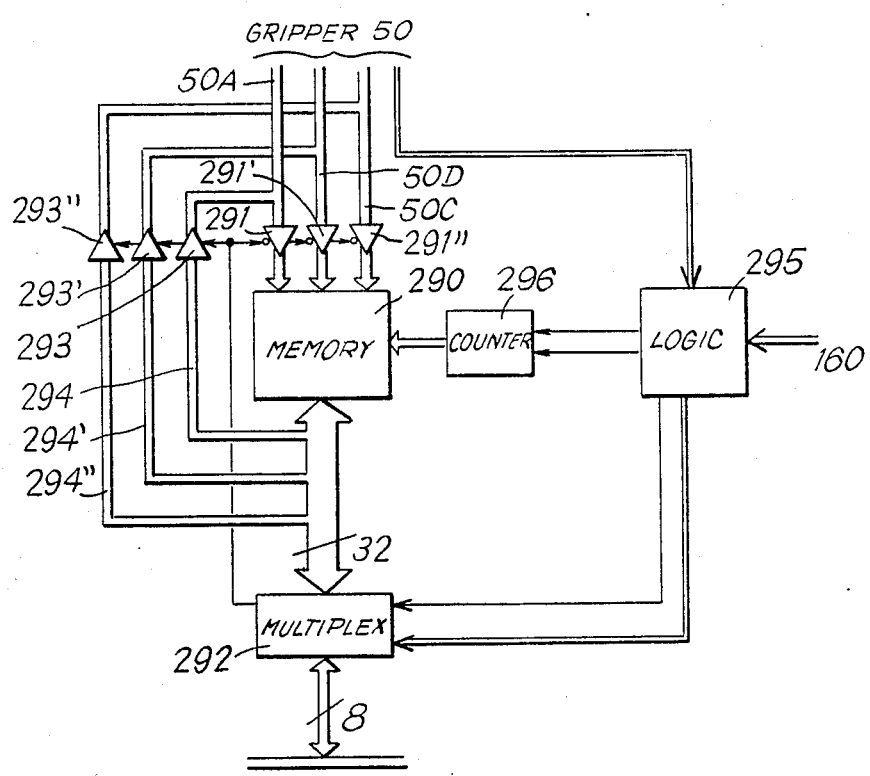

SYSTEM FOR THE AUTOMATIC TESTING OF PRINTED CIRCUITS

The present invention relates to the automatic testing of microprocessor printed circuits.

In numerous apparatus using electronic circuits, the latter are implanted on printed circuits cards or boards. For the manufacturer, there is the problem of testing these circuits with a view to monitoring or repair. In the case of apparatus manufactured on a large scale or mass-produced, it is natural to seek to lower the cost of the test by perfecting the automatic test stands for testing the printed circuits rapidly and without requiring highly qualified staff. Now, microprocessor circuits are being used more and the existing automatic test equipments for testing such circuits generally comprise a large-size central system connected on the one hand to a console and on the other hand to the circuit to be tested via a specific interface. These equipments are heavy and expensive and the use thereof appears to be justified only in limited cases.

It is therefore an object of the present invention to provide a centralized test system, i.e., a system adapted to the testing of different printed circuits incpororated in a particular apparatus or group of apparatus. Another object of the invention is to provide a test system capable of testing printed circuits with a microprocessor and those without microprocessor devices. A further object of the invention is to enable the testing process or be performed automatically but at a relatively low cost, so as to allow a rapid amortization of the system.

These objects are attained by means of a test system comprising a standard basic unit, a display device, and specific intermediate units corresponding respectively to the different cards to be tested, in which system, according to the invention:

a bulk memory device is connected to the basic unit to transmit thereto the programs relative to the tests to be made on each card to be tested, the basic unit comprises a micro-computer system which comprises at least: one circuit for linkage with the bulk memory device, a central unit circuit with a microprocessor, a read-only memory, a read/write memory circuit adapted to record test programs transmitted by the bulk memory device, an input and output interface circuit comprising means for storing the signals transmitted and received by this interface circuit, and conductors or busses connecting said circuits of the basic unit to one another, and a simulation device comprises a microprocessor simulation circuit connected to said busses of the basic unit and a gripper connected to this simulation circuit and adapted to be connected to the connection terminals of a microprocessor package on the card to be tested in the case of testing a microprocessor card.

In this way, the test system according to the invention makes it possible to effect, on the one hand, a static test—i.e. a test of low speed signals—by presenting, on outputs of the interface circuit, a concatenation of logic interrogation patterns and by collecting, on inputs of the interface circuit, the corresponding response patterns and, on the other hand, a dynamic test—i.e. a test of high speed signals—of a microprocessor card by simulating said microprocessor particularly to stimulate its environment by one or more pre-established programs and to test its resources. In the first case, the test information (interrogation patterns and response patterns) is transferred via the input and output interface circuit. The storage means provided in this interfaced circuit allow each logic interrogation pattern to be presented in the inputs of the card to be tested for a necessary time interval. Also, said storage means makes is possible to wait until each logic response pattern has attained a stable state before examining same. In the second case, in addition, address, data and control signals are transmitted from the basic unit to the card to be tested via the simulation device and the gripper to which it is connected and response data signals may be transmitted from the card to be tested to the basic unit by the same path, but in opposite direction.

Advantageously, the simulation device further comprises a plug connected to a ROM simulation circuit and adapted to be connected to the connection terminals of a ROM package support present on the card to be tested.

It is thus possible to perform an additional a functional test of a microprocessor card by causing said microprocessor to operate so that it effects a predetermined test program to which it has access via the ROM simulation device. This program is advantageously loaded from the bulk memory device into a read/write (R/W) memory circuit. The association of the microprocessor of the card to be tested with a virtual ROM is thus realized and, as soon as the program contained in the latter is effected, it may be replaced by a new program read in the bulk memory device. Due to this configuration, a complete test of a microprocessor card is carried out by means of relatively inexpensive hardware with virtually no limitation of the duration of the test apart from that imposed by the capacity of the memories used.

The invention will be more readily understood on reading the following description with reference to the accompanying drawings, in which:

FIG. 1 is a general diagram of a test system according to the invention,

FIG. 2 shows more detailed diagrams of circuits of the basic unit forming part of the system of FIG. 1, FIGS. 3 and 4 illustrate embodiments of circuits of intermediate units specific of cards to be tested, FIG. 5 is a more detailed diagram of the microprocessor simulation device forming part of the system of FIG. 1, FIG. 6 illustrates the ROM simulation device forming part of the system of FIG. 1, FIG. 7 is a flow chart relative to the operations carried out by the test system of FIG. 1 for execution of a functional test, and FIG. 8 is a partial diagram of a variant embodiment of the simulation device.

Referring now to the drawings, the test system illustrated in FIG. 1 comprises a standard basic unit 10 connected to a bulk memory device 11, to a console 12 and, via a specific unit 20, to a card 30 to be tested.

The basic unit 10 comprises a micro-computer system comprising in particular a central unit circuit 100, a read-only memory (ROM) circuit 110, a read/write memory (RAM) circuit 120, a circuit 130 forming and interface with the bulk memory device 11 and an input and output interface circuit 140 connectable to the specific unit 20. These different circuits are interconnected by means of busses 150 and are implanted on respective cards housed in the same package. Such a micro-computer structure is conventional. Only a brief description of these different circuits will be given hereinafter with reference to FIG. 2.

References 151, 152, 153 respectively designate the address, data and control busses. The words routed by the address and data busses are for example of sixteen bits A0 to A15 and of eight bits D0 to D7, respectively.

The central unit circuit 100 comprises a central microprocessor unit 101 associated with quartz clock circuit 102, both connected to the control busses 153. The microprocessor 101 is for example the one marketed under reference "6800" by the U.S. firm MOTOROLA. Buffer amplifiers 103, 103' amplify the data passing from bus 152 to the microprocessor 101 or vice versa. These buffer amplifiers are controlled by signals produced by a read/write selector 104 as a function of signals coming from the control bus 153. The words of addresses produced by the microprocessor are amplified and transmitted to the address bus 151. The latter is also connected to an address comparator circuit 105 and to a decoding circuit 106. Interface circuits 107, 107' and 108 are connected to respective plugs P1, P2 and P3–P4 which make it possible to connect the central unit circuit 100, and therefore the basic unit 10, to the console 12 by a cable 15 and, if desired, to a keyboard and a printer. Addressing of the interface circuits is effected by means of the decoding circuit 106 which receives part of the address words (for example the four bits of lowest weight), whilst the address comparator 105 receives the remaining part. The circuit 107, 107' are for example series interface circuits (ACIA), whilst circuit 108 is for example a programmable interface adapter (PIA). Buffer amplifiers 109, 109' amplify the data passing from bus 152 to the interface circuits or vice versa. They are controlled by signals produced by the selector 104.

ROM circuit 110 stores the resident programs relative to the basic operation of the test system. In the present embodiment, ROM circuit 110 is used to enable the storing of the monitor program and of the test programs in the read/write memory 120 after resetting of the system. The circuit 110 comprises a ROM unit 111 receiving address words through a buffer amplifier 112. The data words read in the ROM unit 111 are transferred to the bus 152 through a buffer amplifier 113. A switching circuit 115 receives the RESET signal produced in response to the resetting of the system and generates a ROM enable signal applied to buffer amplifier 113 and a signal which is applied on a phantom line 154 for disabling the read/write memory in the ROM zone. When the monitor and test programs are stored in the read/write memory from the bulk memory 11, the switching circuit 115 receives and decodes a particular address word and generates a ROM disable signal which inhibits the transfer of data through the buffer amplifier 113, and a read/write memory enable signal which is transmitted to line 154 for enabling the read/write memory. The circuit 110 is then disabled until reception of a new RESET signal The read/write memory 120 comprises a read/write memory unit 121, for example a dynamic read/write memory of 64 kilobytes, with its associated circuits, viz. read/write memory controller 122, refresh clock 123 and timing generator 124. Buffer amplifiers 125, 125' amplify the data passing from bus 152 to the memory 121 or vice versa. They are controlled by a read/write selection circuit 126. The controller 122 and a decoding and segmentation circuit 127 receive signals transmitted by the control bus 153. The words of addresses coming from bus 151 are applied for a first part (for example the 14 bits of lower weight) to a switching circuit 128, and for a second part (for example the six bits of higher weight) to the decoding and segmentation circuit. The controller 122 also receives part of each address word (for example the two bits of higher weight). In this way, by means of micro switches associated with circuit 127, it is possible to effect segmentation of memory 121 kilobyte by kilobyte. The automatic memory inhibition is performed in response to the reception by the circuit 126 of a disabling signal produced by the circuit 115, or by any other similar signal transmitted by the phantom line and produced by a peripheral device, in particular through circuits 100, 130, 140, and 160.

The interface circuit 130 is intended to allow the transfer into read/write memory of data read in the bulk memory unit. The latter is for example constituted by a floppy disc reader 11. The circuit 130 is therefore a conventional disc interface circuit, comprising a disc controller 131 with its associated circuits, particularly quartz clock circuit 132 and phase lock-out loop circuit 133. The controller 131 is connected to a plug 134 allowing connection to the disc reader by means of a sheet cable 13. Buffer amplifiers 136, 136' amplify the data passing from bus 152 to controller 131 and to the plug 134, or vice versa. They are controlled by a read/write selector 137 receiving signals from the control bus 153 and an address comparator 138 connected to the address bus 151. The selector 137 also furnishes control signals to the disc reader via the plug 134, as a function of words of data received. If necessary, selectors may be provided to be actuated as a function of the density (single density—double density) and/or of the dimensions (5¼ inches or 8 inches) of the floppy discs.

Finally, the circuit 140 essentially comprises programmable interface adapters (PIA) 141 furnishing programmable inputs/outputs and allowing incoming and outgoing data to be stored. The circuits 141 are for example four in number, connected to two plugs 142, 142' for connection of a sheet cable. Each plug 142, 142' is connected to two respective circuits 141. Buffer amplifiers 143, 143' amplify the data passing from bus 152 to circuits 141, or vice versa. They are controlled by a read/write selector 144 as a function of signals transmitted by the control bus 153. An address comparator 145 receives the words of addresses routed by bus 151 and makes it possible to select the interface circuits 141. Each of the latter is connected to the control bus 153 to transmit outgoing signals coming from this bus or incoming signals intended for this bus.

From the foregoing, it is clear that the micro-computer type system with circuits 100, 110, 120, 130 and 140 described succinctly hereinabove is of conventional structure and operation and it is unnecessary to describe it in greater detail here.

It will be noted from FIG. 1 that the basic unit further comprises a circuit 160. The latter forms part of a ROM and microprocessor simulation device of which a detailed description is given hereinafter with reference to FIGS. 5 and 6.

A particular embodiment of an intermediate unit will now be described with reference to FIGS. 1, 3 and 4. In this example, the card 30 is a microprocessor/power elements interface card.

The inputs of the card 30 are 57 in number and the outputs 50 in number. 22 inputs are allocated to the control of 22 power transistors adapted to furnish solenoid actuating signals on 22 respective outputs. 4 inputs control 4 power transistors controlling at the output the switching of a high voltage supply. 3 inputs are connected to operational amplifiers which form part of a 100 Hz clock and two sensor amplifiers on 3 respective outputs. An automatic developer control circuit with, in particular, a digital-to-analog converter and a numerically controlled variable gain amplifier, is associated with 13 inputs and 3 outputs, 6 other inputs and 6 other outputs correspond to 4 triacs and to 2 triac control circuits. Also noted on the card are an optical coupler and an electroluminescent diode control each associated with an input and an output. Finally, the rest of the inputs and outputs is allocated to supply voltages (−5 V, −4 V, 5 V and 12 V regulated, 27 V non-regulated) applied to the card or delivered thereby.

The specific intermediate unit 20 comprises a circuit 200 which has for its function to convey the signals between the universal interface circuit 140 and the circuits 210, 220, 230 and 240 allocated to the tests of the functions peculiar to the card, these different circuits being interconnected by means of bus 250 (FIG. 1) and being implanted for example on different respective cards mounted in the same package.

Circuit 200 (FIG. 3) comprises a plug 201 by which it is connected to the interface circuit 140 by means of a sheet cable 14. The signals arriving at plug 201 are, on the one hand, address signals transmitted on an address bus 251 through buffer amplifier 203 and, on the other hand, signalling and control signals applied to an amplifier circuit 204. The signals leaving the plug 201 are data signals coming in particular from a data bus 252. The address signals, after decoding in circuits 210, 220, 230, 240, furnish the control signals for testing the functions of the card. In the example illustrated, the address bus is a bus of 16 bits; the 16 outputs of one of the programmable interface circuits 141 may then be made to correspond thereto. Another circuit 141, on the one hand, will recover the data signals on a bus of 8 bits and, on the other hand, will transmit the signalling and control signals likewise on a bus of 8 bits. In this example, for each control signal, up to 8 test signals may therefore be generated. Furthermore, two circuits 141 only being used, the sheet cable 202 is connected only to one of the plugs 142 and 142'. Of course, these two plugs may be used if necessary in other cases. A circuit 205 generates an automatic reinitialization signal RESET AUT in response to the energization whilst a circuit 205' generates a programmed reinitialization signal RESET PROG. in response to the decoding of a particular address word, circuit 205' having inputs receiving all or part of the bits of addresses at the output of the amplifier 203. An OR gate 205" has two inputs connected to the outputs of the circuits 205 and 205' to transmit a signal RESET onto a conductor 253 in response to the signal RESET AUT or RESET PROG. The amplifier 203 is controlled by a circuit 203' receiving a signal from circuit 205 and one of the signalling and control signals at the output of the circuit 204. The other output signals of this circuit 204 comprise: signalling control signals applied to a plug 206 to control different displays on the package of the intermediate unit (for example: "test under way" "card OK" "card defective"); a signal controlling an energization relay 207 for supply of the card; and a signal for controlling a gate 208 connected between an identifier circuit 209 and the data bus 252. The identifier circuit 209 contains a code for identifying the intermediate unit 20 and the associated card 30 in order to allow, before the actual test, verification by comparison of codes, of the match between the card to be tested and the test program loaded in the basic unit.

Circuits 210, 220, 230, 240 intended for testing special functions of the card 30 will now be described. It will be noted in FIGS. 3 and 4 that, to simplify the representation, the card 30 has been shown with the diagrams of each of these circuits. The test system advantageously comprises connectors 28 (FIG. 1) which are mounted on the intermediate unit, are connected to said circuits 210 and 240 and make it possible to connect the card to be tested to the test system by the normal input and output terminals of this card. This arrangement is preferred to the system of connection comprising contact pins applied with pressure at different points of the printed circuit since, with this system, on the one hand, the input and output connections of the card are not tested and, on the other hand, the pressure exerted on the contact pins may re-establish previously defective contacts on the printed circuit.

Circuit 210 (FIG. 3) is intended for testing the supplies and the 100 Hz clock of card 30. An address selection circuit 211 makes it possible to decode control signals which are stored in a memory 212 concerning the control signals to be applied on inputs of the card 30 and in a memory 213 concerning the signals controlling the collection of the test results. The digital signals recorded in memory 212 are converted into analog form by means of a converter 214 and amplified by an amplifier 215 before being applied to the desired inputs of the card 30 in order to ensure operation of the supplies thereof. A circuit 216 comprises loads and analog-to-digital converters which receive the supply voltages available on different outputs of the card and convert these signals to digital form. The supplies are preferably set at a higher value than the nominal value in order to be in unfavourable conditions. The digital values obtained are compared with maxima and minima thresholds and the result of comparison, for each voltage, is available in the form of a bit. The different bits, for example eight, constituting the test results of the different supplies are routed on the bus 252 through a buffer amplifier 216' controlled by an output signal of memory 213. The 100 Hz clock signal is also applied to a load and conversion circuit. The digital signal produced, for example in format of 4 bits, is applied to a buffer amplifier 217. The latter is controlled by an output signal of memory 213, the test of the clock being effected by a program sampling the digital signal applied to the buffer amplifier 217. Finally, it will be noted that the return to zero of the memories 212 and 213 is controlled by the signal RESET conveyed by conductor 253.

Circuit 220 (FIG. 3) is intended for testing the 22 transistors of the card 30. An address detector 221 decodes the addresses received from bus 251 and applies corresponding control signals to a for example 4-bit, right-hand phase shift register with series input and parallel output. The bit present on a first output of register 222 is applied to the input of a 22-bit, right-hand phase shift register with series input and parallel output. The signals present on outputs of register 223 are converted by a D/A converter 224 and amplified by an amplifier 225 before being applied to the 22 inputs of card 30 allocated to the transistors to be tested. The corresponding 22 outputs of the card are applied to a load and analog-to-digital conversion circuit 226. At the output of circuit 226 are therefore available 22 bits representing the test signals of the 22 transistors. The test signals are routed sequentially towards bus 252 in the form of 2 words of 8 bits and one word of 6 bits through buffer amplifiers 227, 228, 229 controlled by the signals present on the second, third and fourth outputs of register 222. The return to zero of registers 222, 223 is controlled by the signal RESET.

Circuit 230 (FIG. 4) is intended for testing the 4 triacs of the card as well as other circuits of the card (particularly the amplifiers of sensors, the 4 power transistors controlling the high voltage supply switching and the optical coupler). An address decoder 231 connected at the input to the bus 251 applies control signals to the series input of a first phase shift register 232, to the write-in and erasure enable inputs of a memory 233, to the series input of a second phase shift register 234 and to the input of a second memory 235. The parallel outputs, for example in 4 bits, of the register 234 are applied on the one hand to the input of the memory 233 and, on the other hand, to a relay control circuit 236. The parallel outputs, for example in 7 bits, of the registers 232 are connected to 7 corresponding inputs of the card 30 via converter circuit 232' and amplifier circuit 232''. Similarly, the memory 233 is connected at the output, for example in 4 bits, to 4 inputs of the card 30 via the converter circuit 233' and amplifier circuit 233''. The circuit 236 controls a relay intended to energize a load connected to an output of the card 30 and included in a load and logic conversion circuit 238. Another load and logic conversion circuit 237 has its inputs connected to other, for example 7, outputs of the card 30. At the output of the circuits 237, 238, there are therefore 8 test signals available which are routed on the bus 252 through a buffer amplifier 239 controlled by the memory 235. The returns to zero of registers 232, 234 and of the memory 235 are controlled by the signal RESET.

Circuit 240 (FIG. 4) is intended for testing the elements of card 30 allocated to automatic development control. Schematically, these elements comprise a digital-to-analog converter 31 whose output is applied to a gain G amplifier 32 and to an input of a comparator 33. The other input of this comparator receives the output signal of a numerically controlled gain amplifier 34. A divider 35 which controls the comparator 33 and an electroluminescent diode control circuit 36 are also provided. The circuit 240 comprises an address selector 241 whose input receives words of addresses of bus 251 and which delivers at the output signals applied to a first counter 242, a second counter 243, a register 244 with series input and parallel outputs, a divider control circuit 245 and a memory 246. The contents of counters 242, 243 are converted by logic converters 242', 243' in the form of numeric words of 8 bits and 4 bits applied to the appropriate inputs of the card 30 in order respectively to form the word applied to the input of the converter 31 and the word controlling the gain of amplifier 34. This latter receives on its input an analog signal produced by conversion by means of a converter 244' of the word present at the ouput of the register 244. The numeric word at the output of the converter 242' is amplified and converted in analog form by means of circuits 242'' and 247. The resultant analog signal is applied to the inputs of two amplifiers 247', 247'' of gains G' and G''. A first comparator 248 receives on its positive and negative inputs respectively, the output signal of amplifier 32 and that of amplifier 247'. A second comparator 248' receives on its positive and negative inputs respectively, the output signal of amplifier 32 and that of amplifier 247''. The output signals of comparators 248 and 248' constitute test signals making it possible to check that the gain G of amplifier 32 is included between two predetermined values G' and G''. The output of circuit 245 is connected to the divider circuit 35 whilst the circuit 36 receives a signal formed by one of the output bits of the logic converter 243'. Load and logic conversion circuits 249, 249' have their inputs connected to the outputs of comparator 33 and circuit 36; their output signals constitute, with the signals issuing from comparators 248, 248', the test signals produced by circuit 240, signals which are routed on the bus 252 through a buffer amplifier 246' controlled by the memory 246. The return to zero of this memory as well as of counters 242, 243 and of register 244 is controlled by the signal RESET.

Operation of the circuits described hereinbefore of the intermediate unit follows from the foregoing. The circuits make it possible to carry out a static test of the card 30 particularly by the following operations:
  initialization of the test system,
  connection of the card to be tested,
  loading of the corresponding test programm in the basic unit,
  control of identity between the identifier code of the intermediate unit and a code contained in the program loaded in the basic unit,
  sequential test of the elements of the card in the order determined by the program with realization of successive phases each comprising: re-initialization of circuits of the intermediate unit, transmission of words of addresses towards the intermediate unit, storage at the level of interface circuit of the basic unit of the resultant test signals produced, comparison of the configuration of these test signals with a predetermined configuration and recording of the result of comparison,
  control of the results of comparison, and
  display of the result of the test.

Of course, for carrying out the static tests, the circuits of the intermediate unit will each time be adapted to the card to be tested, the principles of execution and operation of these circuits being the same as those relative to the circuits described hereinbefore by way of example with reference to FIGS. 3 and 4.

An embodiment of the microprocessor simulation device forming part of the test system according to the invention will now be described with reference to FIG. 5. This device may in practice be divided into two circuits 160 and 260 implanted for example on two different cards. The circuit 160, or basic simulator circuit, is a standard circuit independent of the microprocessors to be simulated, which may be housed in the package of the basic unit 10 where it is connected to the busses 150. The circuit 260, or microprocessor simulator circuit, is specific to the microprocessor to be simulated and present on the card to be tested; it may be housed in the package of the intermediate unit 20 where it is connected to busses 250'. The two circuits 160 and 260 are connected via a sheet cable 16 which connects a plug 161 of circuit 160 to a plug 29 of the intermediate unit (FIG. 1).

The simulation of the microprocessor of a card to be tested comprises in particular the generation of control signals such as those relative to the enabling or control of read-out or write-in (R/W, IOW, IOR, MW, MR, VMA), and to the de-activation of the microprocessor to be simulated, and the simulation of a range of addresses or memory zone in the storage assembly of the microprocessor to be simulated.

In this way, the simulator circuit 160 comprises a decoding circuit 162 receiving address words in order to generate output signals which are transmitted to the interface circuit 260 through the plug 161 in order to allow the generation and reception of control signals by the interface circuit 260. The address words are received from the bus 151 through buffer amplifiers 163, 163' associated respectively with the 8 higher bits and with the 8 lower bits. A low part (for example the 4 lower bits) of the address words is received by the decoding circuit 162 and the remaining part is applied to an address comparator 164 for comparison with a word preselected by the actuation of micro-switches. The output signal of the comparator 164 is used as control signal for the decoding circuit 162 and for a decoding circuit 164' which receives a lower part (for example the 3 lower bits) of the address words. The decoding circuit 164' generates a control signal for a generator 166 of "faked" addresses. The data bus 152 is connected to the plug 161 by means of an output data bus 152a and an input data bus 152b provided with respective buffer amplifiers circuits 167a, 167b.

The data words at the output of gate circuit 167 are applied in parallel to the inputs of latching circuits 166a, 166b forming part of the generator 166 of "faked" addresses. The object of the generator 166 is to simulate, into an available zone of the memory plane of the microprocessor of the basic unit 10, a range of addresses or memory zone included in the memory plane of the microprocessor of the card to be tested. The generator 166 comprises 8 gates 166-8 to 166-15 receiving the 8 higher bits of the address words from the buffer amplifier 163 and individually controlled by signals produced by the latching circuit 166a. 8 further gates 166'-8 to 166'-15 have inputs connected to respective outputs of the latching circuit 166b and are individually controlled by signals opposite to those controlling the gates 166-8 to 166-15. The "faked" addresses are constituted by 8 lower bits received from the buffer amplifier 163' and 8 higher bits received from the generator 166, the outputs of the gates 166-8 to 166-15 being connected to the respective outputs of the gates 166'-8 to 166'-15 to form the 8 outputs of the generator 166. By apppropriate selective opening or closing of the gates 166-8 to 166-15 and 166'-8 to 166'-15, it is possible to adjust the width of the simulated memory zone of the memory plane of the microprocessor to be tested, and by appropriate variation of the "faked" high bits, it is possible to shift this memory zone along this whole memory plane. The "faked" addresses are transmitted to the microprocessor simulator 260 through the plug 161 on an address bus 151a provided with an amplifying circuit. The data words which are latched in the circuits 166a and 166b determine the width and the location of the simulated memory zone of the memory plane of the simulated microprocessor; the e width and location and their possible variation are then defined by the test program.

The memory space in the microprocessor of the basic unit which is used for simulating a window in the microprocessor of the card to be tested is selected by means of micro-switches 168' connected to a comparator 168. This comparator receives the 8 higher bits of the address words from the gate circuit 163 for individual comparison with the states of the micro-switches 168'. The signals produced as results of these comparisons are compared to the output signals of the latching circuit 166a. When the result of all comparisons is positive, the comparator 168 generates a signal which is applied to a control signals generator 169 in order to allow the generation of a signal CSEM. The signal CSEM is transmitted to the microprocessor simulator 260 for producing a signal enabling the reading in the simulated memory zone. The control signal generator 169 also receives control signals from the control bus 153: R/W (read/write), VMA (validation memory address) and 2 (clock signal), and produces signals R/W and CSTEST which are transmitted to the interface circuit 260.

The microprocessor 260 comprises an enabling circuit 261 constituted by a plurality of latches each receiving a signal produced by the decoding circuit 162. The control signals R/W, CSTEST and CSEM are received by a dynamic signals generator 262. Considering for example that the microprocessor of the card to be tested is a "8080" type microprocessor marketed by the U.S. company INTEL, the microprocessor simulator 260 may be designed, first to generate the following signals: static control signals DES $\mu$P and FORCED RESET, and dynamic control signals NIOWR (write) NIORD (read) and NMEMRD (memory enable) and, secondly, to receive the following control signals: NRESET (reset), NINT (interruption), VDD, CKOUT (external clock), and CKIN (internal clock).

The control signals generated are transmitted to a control bus 253' of the intermediate unit 20. The static signals DES $\mu$P and FORCED RESET are produced directly by the circuit 261 in response to respective signals from the decoding circuit 162. The dynamic signals NIOWR, NIORD and NMERD are produced by the generator 262 and transmitted to the bus 253' through gates 263 controlled by signals which are produced by the circuit 261 in response to respective enabling signals from the decoding circuit 162. The signals NRESET, NINT, VDD, CKOUT and CKIN are received in a reading circuit 264 through respective gates 265. The gates 265 are individually controlled by signals which are produced by the circuit 261 in response to respective enabling signals from the decoding circuit 162. The data representative of the received signals is stored in memory means 264a of the reading circuit 264. The frequency of the clock signals CKOUT and CKIN is measured by means of a counting circuit 264b included in the reading circuit 264. The operation of the counting circuit 264b is controlled by a signal also produced by the circuit 261 in response to a respective signal from the decoding circuit 162. The storing in the memory means 264a of the data word representative of the received signals is controlled by a signal produced by the generator 262 as a combination of the signals R/W and CSTEST.

The address words from the bus 151a are transmitted to an address bus 251' of the intermediate unit through buffer amplifier 266 which is controlled by a signal produced by the generator 262 in response to the signal CSEM.

Data words from the output data bus 152a are transmitted to a data bus 252' of the intermediate unit through buffer amplifier 267a, and data words from the bus 252' are transmitted to the input data bus 152b through buffer amplifier 267b. The output of the memory means 264a of the reading circuit 264 is also connected to the input data bus 152b downstream of the buffer amplifier 267b. The buffer amplifiers 267a, 267b are respectively controlled by the signals produced by the generator 262 to generate the write control signal NIOWR and the read control signal NIORD. Finally, a signal R/W' is produced by the generator 262 as a combination of the signals R/W, CSTEST, and CSEM, and is transmitted to the simulator circuit 160 in order to control the buffer amplifiers 167a, 167b. With this arrangement, data representative of the control signals received by the interface circuit 260 as well as data available on the bus 252' can be read directly on the data bus 152 of the basic unit.

The microprocessor simulation device further comprises a gripper 50 (FIG. 1) which is connected to busses 251', 252' and which is such as to grip on the connection terminals of the microprocessor package present on the card to be tested.

It should be noted that the present invention does not consist in producing a special microprocessor simulation device. The device described hereinbefore with reference to FIG. 5 must be considered as an embodiment of such a simulation circuit.

Reference will now be made to FIG. 7 which illustrates a flow chart of the functional test operations of a microprocessor card. If necessary, a static test of elements of the card may be effected as described hereinabove. The card being connected on the connector 28 and the gripper 50 being connected on the microprocessor of the card, the operations carried out are as follows:

initialization of the system.

test of the static signals VDD, NRESET, NINT, CKIN and CKOUT; for the test of VDD, the value of VDD is read after this voltage has been established and cancelled by appropriate control through the interface circuit 130; the signals NRESET and NINT are tested after control of the passage thereof to the values 0 and 1; the signals CKIN and CKOUT are tested by reading of the content of the counting circuits in the interface 260; and an error message is displayed in case of defect.

ROM test by establishing static controls, read-out of the contents of the ROM, comparison of these contents by units with different units pre-recorded in a bulk memory and storage of the results of the comparisons in result memory boxes, the display of a possible error message being deferred.

read/write memory test by establishing static controls, and by at least one cycle comprising write-in in the read/write memory, read-out in the read/write memory, comparison of the configurations written and read, and the storage of the result in a result memory box, the display of a possible error message being deferred.

test of the inputs of the card by establishing static controls through the interface circuit 140, then execution of cycles comprising the establishment of addresses by the simulator circuit, read-out of the data and storage of result in a result matrix.

management of the memory boxes and the result matrix by processing the results and display of the possible defects.

test of the outputs of the card by establishment of the static controls through the interface circuit 140 then, as for the input test, execution of successive cycles comprising the establishment of addresses, read-out on the data bus and storage of result in a result matrix.

management of the result matrix by processing the stored results and displaying the possible defects.

real-time test of the simulated microprocessor by configuration of a state by means of the interface circuit 140 with a view to placing the inputs of the card to be tested in a static state predetermined by the test program, creation of a real-time clock, configuration of another static state, verification of the variation of the states concerned (so-called rendez-vous method) and display of a message in the case of defect, and, end of test sequence comprising the test of the presence of a defect, the test of program looping (number of loops programmed), signalling of the general result on an indicator light and stoppage.

A ROM simulation device adapted to be used in the test system according to the invention will be now described. This device is intended to make the microprocessor of the card to be tested operate on a simulated ROM in place of the ROM of this card. The ROM simulation device comprises the above described simulator circuit 160 and an interface circuit 270 which is connectable to the simulator circuit 160 through plug 29 in place of the simulator circuit 260 or in parallel therewith.

The interface circuit 270 (FIG. 6) comprises a read/write memory 271 and is designed to allow the use of this memory as a read/write memory for the simulator circuit 160 and as a ROM for the simulated microprocessor. A plug 60 which is intended to be plugged on the card to be tested in place of the ROM, is connected to the circuit 270 through an address bus 271a, a data bus 272a and conductors 273a for the transmission of control signals.

The ROM simulation interface circuit 270 includes an address bus 271' connected to the address inputs of the memory 271 and receiving address words from the bus 251a through buffer amplifier 274 and address words from the bus 271a through buffer amplifier 274'. Similarly, the interface circuit 270 includes a data bus 272' which is connected to the output data bus 152a through buffer amplifier 275a, to the input data bus 152b through buffer amplifier 275b and to the data bus 272a through a bidirectional buffer amplifier 275'.

In this example, the memory 271 is formed of two memory units of 2 kilobytes. The address words applied to the memory are of 11 bits, the 12th bit A11 of the address words received being used to select one of the two units. On one side, the bit A11 received from the simulator circuit and its opposite are applied to the inputs CS of the memory units through gates 276; on the other side, the bit A11 received from the plug 60 (or a signal VPP, depending upon the size of the simulated ROM) and its opposite are applied to the inputs CS of the memory units through gates 276'. The CS and DE terminals of the support of the simulated ROM are connected to the DE inputs of the memory units through lines 273a, an OR circuit 277" and a gate 277'. On the other side, the DE inputs of the memory units are connected to ground through a gate 277. The R/W inputs of the memory units receive the signal R/W from the simulator circuit through a buffer amplifier 278 and a signal W from the microprocessor of the card to be tested through a buffer amplifier 278'. The signal W is picked-up by means of a gripper 51 at the appropriate terminal of the microprocessor.

A latch and amplifying gate circuit 279 receives a part (for example the 8 higher bits) of the address words from the bus 271' and has its outputs connected to the input data bus 152b.

The signal CSEM received from the simulator circuit allows the opening of buffer amplifiers 274, 276, 277, 278 when the memory 271 is loaded before the simulation process and controls the closing of buffer amplifiers 274, 276, 277 and 278 during the simulation process. Reversely, the opposite of the signal CSEM is used as a control signal for the buffer amplifiers 274', 276', 277' and 278'. A control circut 280 receives the signals R/W, CSEM and CSTEST and produces control signals for the buffer amplifiers 275a, 275b, 152a, 152b and for the circuit 279. The buffer amplifier 275' is controlled by the signal W at the output of the gate 278' and is enabled by the output of an OR circuit receiving the reversed signal CSEM and the output of buffer amplifier 277'; the reversed output of this OR circuit enables the circuit 279.

The ROM simulation is performed as follows.

The memory 271 is loaded from the bulk memory device 11 via busses 152, 152a and 272', the microprocessor of the card to be tested being de-activated by application of a RESET signal. The buffer amplifiers 274 to 278 and 274' to 278' are then controlled to inhibit writing in the memory 271 from the simulator circuit and to allow read-out in the memory 271 from the tested card. After execution of the instructions contained in the memory 271, correct operation is tested by examining the configuration of bits of addresses on the bus 271'. This configuration is latched in the circuit 279 and can be read via busses 152b and 152. Each program loaded in the memory 271 can be designed so that it terminates in a loop concerning for example one or two low addresses on the address bus 271'. The circuit 279 receives address bits not concerned by this end of program loop and stores the test result signal. A new test program can be loaded from the bulk memory into the read/write memory 271, the microprocessor of the card to be tested being deactivated by application of a RESET signal, and the process can be repeated. This RESET signal is produced by a latch circuit 281 in response to the reception of a corresponding enabling signal from the decoding circuit 162; the latch circuit 281 is reset also in response to the reception of a particular signal from the decoding circuit 162. The RESET signal is applied to the microprocessor by means of a particular gripper 52.

The device described above makes it possible to carry out a functional test of the microprocessor card by the following operations:

positioning of the plug 60 and of the gripper 50;
initialization of the system;
execution of successive cycles comprising: de-activation of the microprocessor, loading of the read/write memory 271 by data read in the bulk memory, activation of the microprocessor, recording of the test result, read-out of this result, comparison of the result with a predetermined value and storage of the result of comparison in a result matrix;
processing of the results stored in the matrix, and display of a possible defect message.

As has already been indicated, this functional test may be carried out virtually without any limitation other than that imposed by the bulk memory.

For certain applications, it is desirable to have available a memory zone independent of the system to be tested, that is, a zone in which may be recorded data normally recorded in a memory whose correct operation is in doubt. This memory zone may be arranged in the memory 271 and access from the card may be controlled via buffer amplifier 275'. In this way, a ROM and read/write memory simulation device is obtained.

Various modifications and additions may of course be made to the embodiment described hereinabove of a test system and process according to the invention.

In the case of the microprocessor of the card to be tested functioning at a higher speed than that of the microprocessor of the basic unit 10, the transfer between the data bus 252' of the specific unit 20 and the terminals of the gripper 50 may be effected by using a technique, as illustrated in FIG. 8. A memory unit 290 may receive via the gripper 50, from respective busses 50A, 50D, 50C and from respective buffer amplifiers 291, 291', 291", information of address, data and control available at the terminals of the microprocessor package of the card to be tested. The memory 290 is connected bidirectionally to the bus 152' via a switching or multiplexing circuit 292. For example, to pass from a 32-bit format at the output of the memory 290 to the 8-bit format of the bus 152' (or vice versa), a four-channel switching circuit 292 is used. Finally, a transfer of information from memory 28 on busses 50A, 50D, 50C is effected via busses 294, 294', 294" on which are mounted respective buffer amplifiers 293, 293', 293". A logic unit 295 receives, on the one hand, via the gripper 50, signals present on the terminals of the microprocessor of the card to be tested, for example the clock signals and signals such as R/W, VMA, MR, IOW, IOR, and, on the other hand, control signals coming from the simulator circuit 160. In response to the signals received, the logic unit 295 produces a read-out/write-in signal L/E which is applied to the switching circuit 292 and to buffer amplifiers 291, 291', 291" and 293, 293', 293"; the signal L/E simultaneously controls the opening (or closure) of the buffer amplifiers 291, 291', 291" and the closure (or opening) of buffer amplifiers 293, 293', 293". The logic unit 295 thus produces a signal for controlling the switching circuit 292, for example a 2-bit signal in the case of a four-channel switching. A counter 296 controls read-out or write-in in the memory 290 at the rate defined by a clock provided in the logic unit 295. In this way, information intended for bus 152' may be recorded in the memory 290 at a rate corresponding to the speed of real-time operation of the microprocessor of the card to be tested, the counter 296 being supplied with clock pulses at the necessary high frequency. This information is then read at lower speed compatible with that of operation of the microprocessor of the basic unit 10, supplying the counter 296 with clock pulses at a lower frequency. The reverse operation may be carried out by initially recording in memory 290 information coming from bus 152' then restoring it at the necessary speed through the buffer amplifiers 293, 293', 293".

What is claimed is:

1. A test system for the centralized automatic testing of microprocessor printed circuit cards, comprising:
a bulk memory device for storing programs relative to tests to be made on each card to be tested;
a standard basic unit having essentially a micro-computer structure and comprising at least: one circuit for connection with the bulk memory device, a central unit circuit having a microprocessor, a read-only memory, a read/write memory circuit for recording test programs read in from the bulk memory device, an input/output interface circuit comprising means for storing the signals transmitted and received by said input/output interface circuit, and busses connecting said circuits of the basic unit to one another and comprising an address bus, a data bus and a central bus;

a display device connected to said standard basic unit;

specific intermediate units corresponding to the different cards to be tested and each connectable on the one hand to said input/output interface circuit and, on the other hand, to the corresponding card to be tested, whereby a static test can be performed by connecting a card to be tested to the basic unit via the corresponding specific intermediate unit;

a microprocessor simulation circuit connected to said busses of the basic unit and comprising:

means connected to the control bus of the basic unit for generating control signals substantially similar to signals used in the microprocessor of the card to be tested in response to control signals used in the microprocessor of the basic unit;

a generator of faked addresses having an input connected to the address bus of the basic unit and an output connected to an address bus of an interface means, to convert each received address word to a faked address word of which at least a first portion has a selected value; and comparator means having an input connected to the address bus of the basic unit and an output connected to said means for generating control signals for enabling the generation of a read signal on a control bus of an interface means when the first portion of an address word received by said comparator means has a predetermined value to control reading in a simulated memory zone, whereby a selected zone of a memory plane of the microprocessor of the card to be tested can be simulated in a predetermined zone of the memory plane of the microprocessor of the basic unit;

interface means having the control bus receiving control signals from said means for generating control signals, the address bus connected to the address bus of the basic unit, a data bus connected to the data bus of the basic unit, and means for controlling the flow of data between data busses, and a gripper connected to the control, address and data busses of said interface means, and adapted to be connected to connection terminals of a package of the microprocessor on the card to be tested, whereby a dynamic test of said card can be performed, including simulation of the microprocessor thereof, by connecting said gripper to the terminals of said package.

2. A test system according to claim 1, wherein said microprocessor simulation circuit includes memory means connected to the data bus of said basic unit and to said generator of faked addresses for selectively varying said selected value of the first portion of address words as a function of data words received from said data bus of the basic unit, in order to vary the size and location, in the memory plane of the microprocessor of the card to be tested, of the simulated memory zone.

3. A test system according to claim 1, wherein said interface means further includes memory circuit means having an input connected to the control bus of said interface means for receiving control signals from the microprocessor of the card to be tested and an output connected to the data bus of said basic unit.

4. A test system according to claim 3, for the testing of a microprocessor printed circuit card of the kind having a ROM, and further comprising a ROM simulator circuit that includes:

second interface means comprising read/write memory means, means for connecting said read/write memory means to the data bus of said basic unit for loading said read/write memory means with program data read from said bulk memory device, and means for storing data representing a result of the execution by the microprocessor of the card to be tested of the program loaded in said read/write memory means; and a plug connected to said second interface means and adapted for connection to connection terminals of a ROM package support present on the card to be tested, whereby a functional test of said card can be performed by causing the microprocessor of the tested card to execute a program loading in said read/write memory means of the ROM simulation circuit.

5. A test system according to claim 4, wherein said means for storing data representing a result comprises a storing circuit receiving address bits from the address bus of the basic unit that is connected to said read/write memory means, and in which said storing circuit is connected to the data bus of the basic unit to allow the reading of said result data.

* * * * *